(12) United States Patent
Xie et al.

(10) Patent No.: US 11,989,107 B2
(45) Date of Patent: *May 21, 2024

(54) APPLICATION OF DYNAMIC TRIM STRATEGY IN A DIE-PROTECTION MEMORY SUB-SYSTEM

(71) Applicant: Micron Technology, Inc., Boise, ID (US)

(72) Inventors: Tingjun Xie, Milpitas, CA (US); Charles See Yeung Kwong, Redwood City, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/860,289

(22) Filed: Jul. 8, 2022

(65) Prior Publication Data

US 2022/0342784 A1  Oct. 27, 2022

Related U.S. Application Data

(63) Continuation of application No. 16/534,772, filed on Aug. 7, 2019, now Pat. No. 11,403,195.

(51) Int. Cl.
*G06F 11/20* (2006.01)
*G06F 3/06* (2006.01)

(52) U.S. Cl.
CPC ........ *G06F 11/2094* (2013.01); *G06F 3/0619* (2013.01); *G06F 3/0659* (2013.01); *G06F 3/0673* (2013.01)

(58) Field of Classification Search
CPC .. G06F 11/2094; G06F 11/076; G06F 11/073; G06F 3/0619; G06F 3/0659; G06F 3/0673; G11C 2029/0409; G11C 2029/0411; G11C 29/021; G11C 29/028; G11C 29/4401; G11C 29/52; G11C 29/81; G11C 29/832; G11C 29/835; G11C 29/84

See application file for complete search history.

(56) References Cited

U.S. PATENT DOCUMENTS

| | | | |
|---|---|---|---|
| 8,874,835 B1 * | 10/2014 | Davis | G06F 3/0679 711/156 |
| 8,924,654 B1 | 12/2014 | Graziano et al. | |
| 10,044,646 B1 | 8/2018 | Detwiler | |
| 10,082,965 B1 | 9/2018 | Tamilarasan et al. | |
| 10,228,878 B1 | 3/2019 | Mateescu et al. | |
| 10,643,700 B2 * | 5/2020 | Qawami | G11C 8/18 |

(Continued)

*Primary Examiner* — Matthew M Kim
*Assistant Examiner* — Matthew N Putaraksa
(74) *Attorney, Agent, or Firm* — Lowenstein Sandler LLP (57) ABSTRACT

A system includes a memory device having a plurality of memory dies and at least a first spare memory die and a processing device coupled to the memory device. The processing device is to perform operations including: tracking a value of a write counter representing a number of write operations performed at the plurality of memory dies; activating the first spare memory die in response to detecting a failure of a first memory die of the plurality of memory dies; storing an offset value of the write counter in response to activating the first spare memory die; and commanding the memory device to modify die trim settings of the first spare memory die at predetermined check point values of the write counter that are offset from the offset value.

20 Claims, 6 Drawing Sheets

(56) References Cited

U.S. PATENT DOCUMENTS

| | | | |
|---|---|---|---|
| 11,403,195 B2* | 8/2022 | Xie | G06F 11/2094 |
| 2013/0046945 A1* | 2/2013 | Abe | G06F 3/0611 |
| | | | 711/E12.103 |
| 2016/0070490 A1 | 3/2016 | Koarashi et al. | |
| 2018/0246794 A1* | 8/2018 | Baty | G06F 11/0727 |
| 2019/0278741 A1* | 9/2019 | Hovis | G11C 29/4401 |
| 2019/0370128 A1 | 12/2019 | Sadavarte et al. | |
| 2020/0043524 A1 | 2/2020 | Roberts | |
| 2020/0097215 A1* | 3/2020 | Bazarsky | G06F 3/0649 |
| 2020/0151052 A1* | 5/2020 | Qawami | G06F 3/0688 |
| 2020/0264809 A1* | 8/2020 | Hara | G06F 3/0679 |

* cited by examiner

APPLICATION OF DYNAMIC TRIM STRATEGY IN A DIE-PROTECTION MEMORY SUB-SYSTEM

RELATED APPLICATIONS

The present application is a continuation of U.S. patent application Ser. No. 16/534,772, filed Aug. 7, 2019, which is incorporated by reference herein.

TECHNICAL FIELD

Embodiments of the disclosure relate generally to memory sub-systems, and more specifically, related to application of dynamic trim strategy in a die-protection memory sub-system.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to application of dynamic trim strategy in a die-protection memory sub-system. A memory sub-system can be a storage device, a memory module, or a hybrid of a storage device and memory module. Examples of storage devices and memory modules are described below in conjunction with FIGS. 1A-1B. In general, a host system can utilize a memory sub-system that includes one or more memory components or devices. The host system can provide data to be stored at the memory sub-system and can request data to be retrieved from the memory sub-system.

In various embodiments, the memory sub-system includes multiple memory components or memory devices that can store data from the host system. The media characteristics of non-volatile memories gradually change from beginning of life to end of life of each memory die in a memory device. These media characteristics include cell voltage threshold (Vt) distribution density, optimal read voltage levels, the degree of damage of read/write disturbances to a self or neighbor memory cell, read/write duration time, and the like. A dynamic trim strategy can be adopted to adapt to these media changes and maximally meet a number of device (or component) specification requirements, e.g., throughput, latency profile, endurance target. The dynamic trim strategy includes periodic modification (e.g., perhaps four to five times per year) to die trim settings of the memory dies of a memory device or component, by modifying values of relevant registers on the dies. The die trim settings can include, therefore, parameters and specification requirements associated with the media characteristics of non-volatile memory that change as the memory sub-system ages with use.

Conventionally, when a memory die fails, the memory sub-system swaps in a spare memory die to replace the failed memory die. In some memory devices, no dynamic modifications are made to die trim settings of the swapped-in spare die. This can cause a higher read bit error rate (RBER) and read-retry trigger-rate (TR) for the spare memory die. The TR is increased for each retry of a read operation due to failing to read targeted data, e.g., where error-correcting code (ECC) fails to decode the data on the media retrieved by an initial read operation. In other memory devices, or under different circumstances, the dynamic modifications to die trim settings of the spare memory die are performed at the same time when dynamic trim modifications are made to the original memory dies. This creates a mismatch between actual drive conditions and efforts to modify die trim settings, which can also lead to extra wear on both the original memory dies and the spare memory die, and can cause degraded system quality of service (QoS), e.g., degraded throughput, latency profile, and the like.

Aspects of the present disclosure address the above and other deficiencies by storing a write counter value (e.g., an offset value of a write counter) in response to replacement of a failed memory die (of the multiple memory dies) with a spare memory die. The write counter is initialized upon activation of the memory device within the memory sub-system and tracks write operations performed at the multiple (original) memory dies. The failure of a memory die can be either a soft or a hard failure. The memory sub-system can activate the spare memory die to replace the failed memory die. Activation of the first spare memory die can include transferring data from the memory die to the spare memory die, and then bringing the spare memory die online with the rest of the multiple memory dies. Bringing the spare memory die online can include switching the spare memory die so it is coupled to a memory controller of the memory sub-system. The memory sub-system can perform modifications to die trim settings of the spare memory die at write count check points offset from the offset value of the write counter that was previously stored, e.g., in lieu of at write count check points from an initial value of the write counter used for making modifications to the die trim settings of the multiple memory dies.

In various embodiments, this process is repeated, as needed, e.g., for a first failed memory die and for a second (or subsequent) failed memory die. The write counter value can be stored in order to set a second offset value (when a second memory die fails) by which to determine timing for subsequent modifications to die trim settings of a second spare memory die that is activated to replace the second failed memory die. In an alternative embodiment, a second write counter can be initialized in response to activation of the spare memory die. The modifications to the die trim settings for the spare memory die can be performed based on the value of the second write counter.

Advantages of the present disclosure include, but are not limited to, use of a straight-forward process to determine optimal write count check points for both original memory dies put into service in a memory device as well as in-service spare memory dies. These write count check points may then drive the timing of performing dynamic modifications to die trim settings of the original memory dies on the one hand and to each in-service spare memory die on the other, without need for additional write counters. This provides consistency between actual drive conditions and optimal die trim settings for both the original memory dies and the in-service spare memory dies. The disclosed embodiments can also be extended to multiple spare dies if more than one spare die is put into operation due to multiple failures of the original memory dies. The advantages further include improved systems quality of service (QoS) (e.g., throughput, latency profile, and the like) and drive endurance for the multiple memory dies of a memory device, including any spare memory dies that have been activated. Additional advantages will be apparent to those skilled in the art in the below description with reference to the present figures.

Figure 1A:
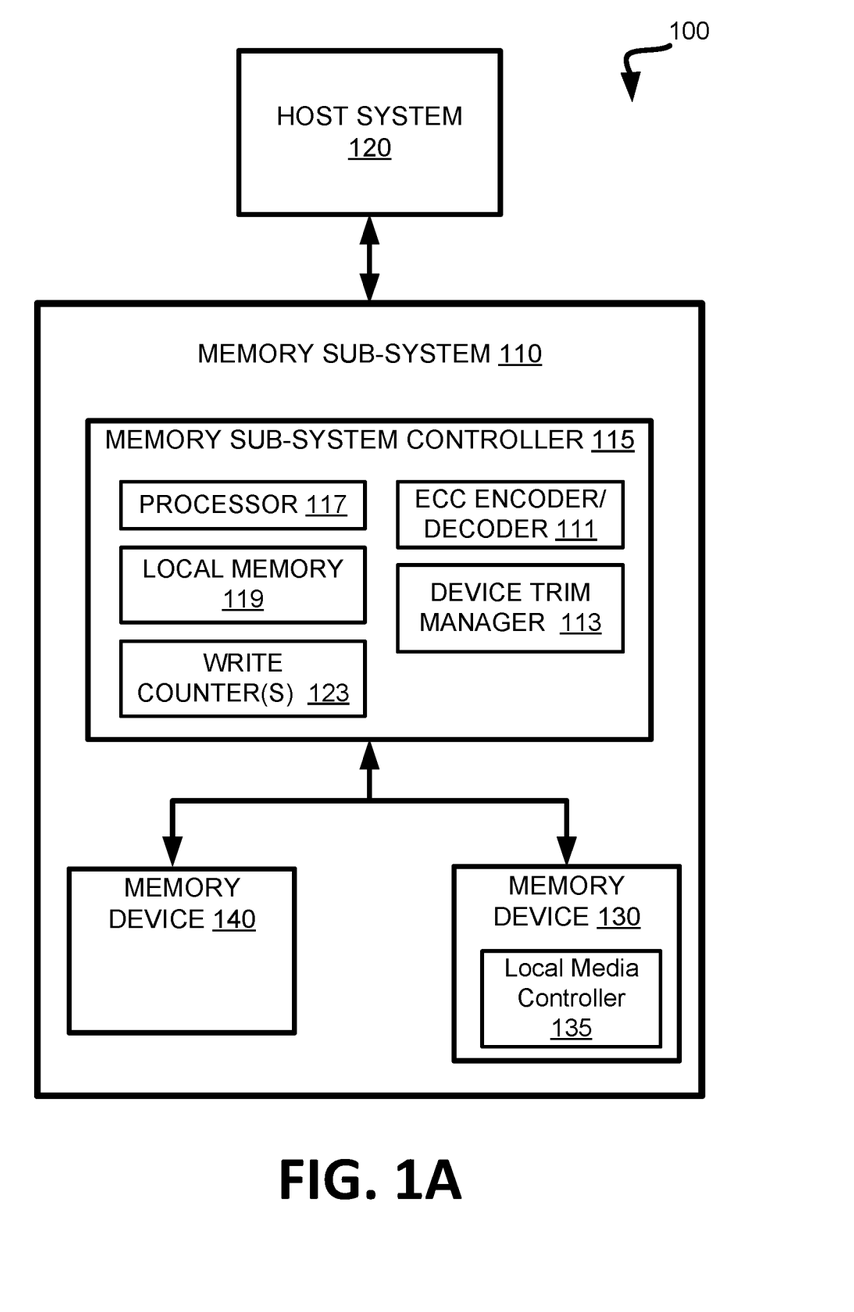
FIGS. 1A-1B illustrate an example computing environment that includes a memory sub-system in accordance with some embodiments of the present disclosure.
Figure 1B:
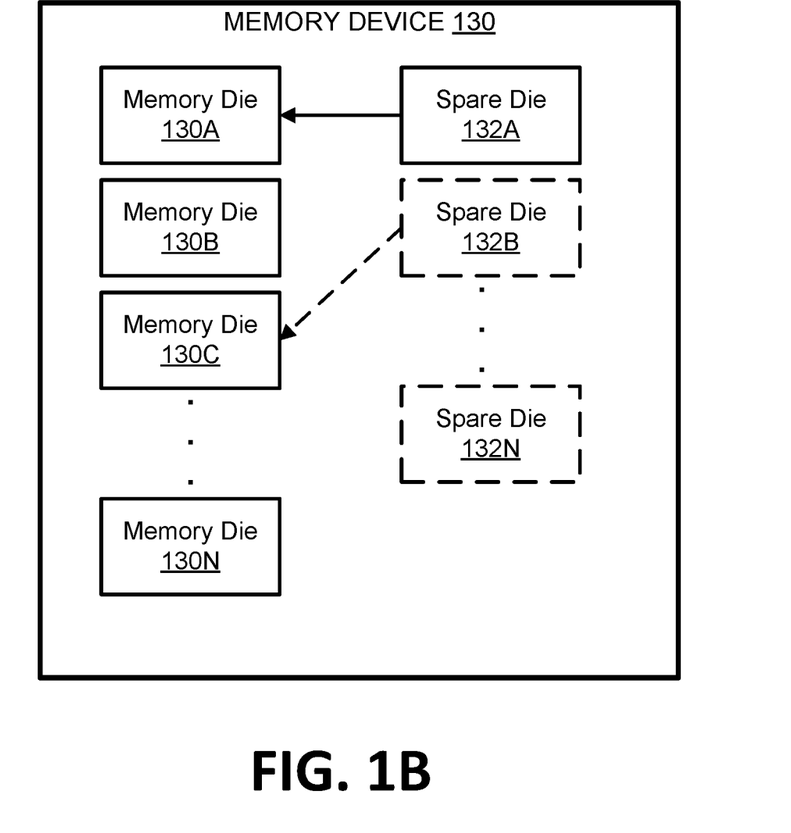

FIGS. 1A-1B illustrate an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. The memory device 130 can be one or more memory component(s), and as illustrated in FIG. 1B, can include multiple memory dies 130A, 130B, 130C, . . . 130N (hereinafter 130A to 130N) and one or more spare dies 132A, 132B, . . . 0.132N (hereinafter 132A to 132N). Each of these dies can be an integrated chip having memory cells for storing data.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components or devices, which can be an indirect communicative connection or direct communicative connection (e.g., without intervening components or devices), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

The cells can store one or more bits per cell. In one embodiment, each of the memory devices 130 can include one or more arrays of memory cells such as single level cells (SLCs), multi-level cells (MLCs), triple level cells (TLCs), or quad-level cells (QLCs), or a combination of such. In some embodiments, a particular memory component or device can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages, memory blocks, or codewords that can refer to a logical unit of the memory component or device used to store data.

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with the memory sub-system controller 115 to execute operations on one or more memory cells of the memory devices 130. In some embodiments, the memory devices 130 are managed memory devices (e.g., managed NAND), which is a raw memory device combined with a local controller (e.g., the local media controller 135) for memory management within the same memory device package.

In some embodiments, the controller 115 includes an error-correcting code (ECC) encoder/decoder 111, a device trim manager 113, and one or more write counters 123. The ECC encoder/decoder 111 can perform ECC encoding and decoding within data written to the memory devices 130 and data read from the memory devices 130, respectively. The ECC decoding can be performed to decode an ECC codeword to verify whether or not there is an error in the data, and in some cases, to correct a detected error.

In various embodiments, device trim manager 113 can operate to track and/or update the value of a first write counter of the one or more write counter 123 in response to each write operation performed at the multiple memory dies 130A to 130N. The device trim manager 113 can activate a first spare memory die (of the one or more spare memory dies 132A to 132N) in response to detection of a failure of a first memory die of the multiple memory dies. The device trim manager 113 can further store an offset value of the first write counter in response to activation of the first spare memory die. For example, the offset value can be stored in the local memory 119, in a register, or other memory coupled to the device trim manager 113. The offset value can represent the value of the write counter at activation of the first spare memory die. The device trim manager 113 can then add the offset value to the value of the write counter in order to know when a check point is met at which the device trim manager 113 is to cause the die trim settings of the first spare memory die to be modified. This process can be repeated for failure of a second memory die, e.g., in response to activating a second spare memory die to replace a second (or subsequent) failed memory die. In embodiments, the device trim manager 113 can be implemented in firmware, hardware, or a combination thereof.

Additional, subsequent offset values can also be stored off which to base check points for additional spare memory dies that are swapped in for failed memory dies. Because 3D cross-point type memory dies are generally accessed (written or read) collectively due to high access speeds, a single write counter is typically used to track write operations performed at the multiple memory dies 130A to 130N. Accordingly, the disclosed embodiments using a single write counter can be most applicable to 3D cross-point type memory, but may also be employed with other fast-access type memories.

In an alternative embodiment, the write counters 123 can include an additional write counter for each of at least some of the spare memory dies 132A to 132N, which can be useful in NAND or other similar types of memory devices. The device trim manager 113 can initialize a second write counter with which to later determine if the write count of the first spare memory die has reached check points for performing device trim modifications to the first spare memory die, e.g., in lieu of storing the offset value of the first write counter. The timing by which the device trim manager 113 sends commands to the first spare memory die (to perform modifications to die trim settings) can then be determined by the second write counter, e.g., separately from write operations sent to the multiple, original memory dies (which the first write counter tracks). Further details with regards to the operations of the device trim manager 113 are described below.

In some embodiments, the controller 115 includes at least a portion of the device trim manager 113. Further, the controller 115 can include a processor 117 (processing device) configured to execute instructions stored in local memory 119 for performing the operations described herein. In some embodiments, the device trim manager 113 is part of the host system 120, an application, or an operating system.

Figure 2:
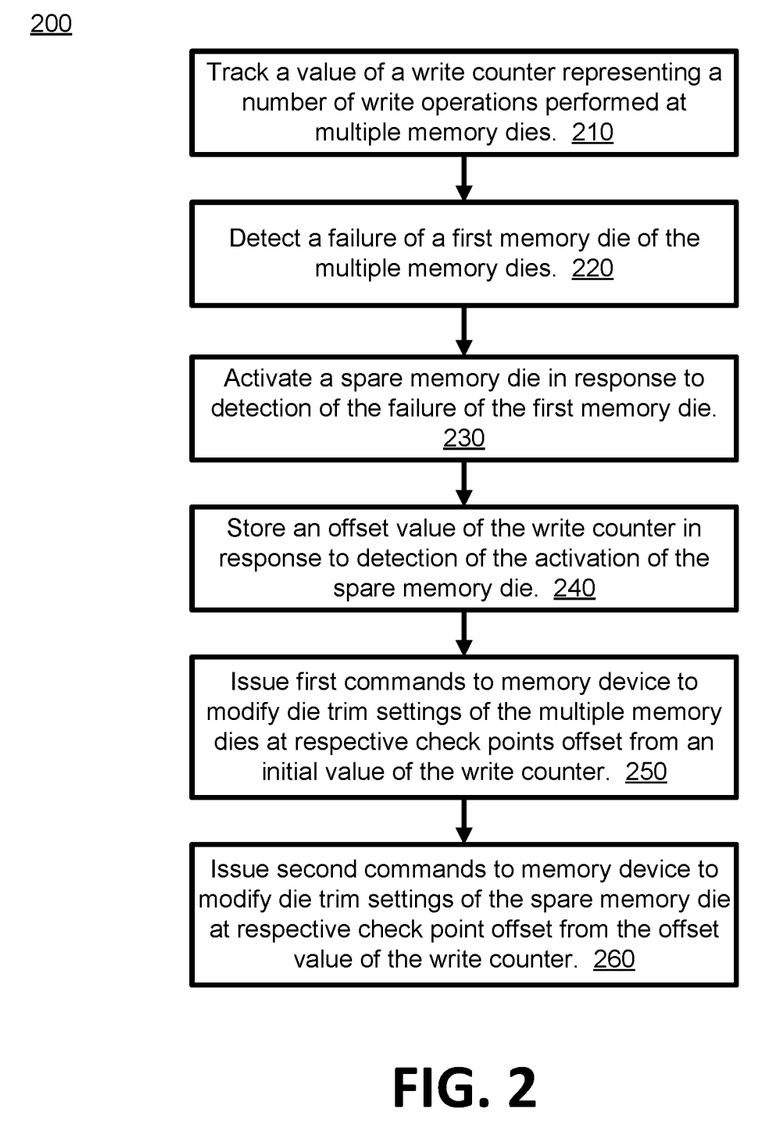
FIG. 2 is a flow diagram of an example method to modify dynamic trim settings in a memory device in accordance with some embodiments of the present disclosure.

FIG. 2 is a flow diagram of an example method 200 to modify dynamic trim settings in a memory device in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the controller 115 (e.g., the device trim manager 113) of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic tracks a value of a write counter representing a number of write operations performed at multiple memory dies. For example, the value of the write counter can be updated at each performance of a write operation at the multiple memory dies, and thus be tracked over time. The processing logic can then detect when the write count (WC) of the write counter value reaches certain predetermined values (WC_1, WC_2, ..., WC_L) at which the processing logic commands the multiple memory dies to update die trim settings.

At operation 220, the processing logic detects a failure of a first memory die of the multiple memory dies. The failure can be a hard failure such as a memory die suddenly becoming partially or totally defective, e.g., incapable of being written and/or read. Or, the failure can be a soft failure, e.g., the memory die inherently becoming vulnerable to media wear and having a higher read bit error rate (RBER) than other healthy dies. Other failures are envisioned.

At operation 230, the processing logic activates the first spare memory die in response to detection of the failure of the first memory die. Activation of the first spare memory die can include transferring data from the first memory die to the spare memory die, and then bringing the spare memory die online with the rest of the multiple memory dies. Bringing the spare memory die online can include switching the spare memory die so it is coupled to the controller 115.

At operation 240, the processing logic stores an offset value ($WC_{off}$) of the write counter in response to activation of the first spare memory die. The offset value can represent the value of the write counter upon activation of the first spare memory die. The offset value can be stored in the local memory 119, in a register, or other memory (or buffer) coupled to the device trim manager 113.

At operation 250, the processing logic issues first commands to the memory device to modify die trim settings of the multiple, original memory dies at respective check points offset from an initial value of the write counter. For example, the processing logic can issue a first command to the memory device to modify die trim settings of the multiple memory dies in response to the value of the write counter reaching a first value (e.g., WC_1), and issue a second command to the memory device to modify the die trim settings of the multiple memory dies in response to the value of the write counter reaching a second value (WC_2), and so forth. The die trim settings can include a number of parameter-based settings, such as for example, some voltages (e.g., read level voltages), reading or programming signal shapes, and adjusting time to perform read operations at end of life of the memory cells.

In various embodiments, these check points (WC_1, WC_2, ..., WC_L) provide the timing at which the die trim settings are modified for the multiple, original memory dies. These check points can be spaced by a predetermined number of write operations that have been performed at the multiple memory dies, e.g., a value of 1 k, 5 k, 10 k, or the like. In some embodiments, the spacing is different (or the same) between different trim suites of die trim settings modifications. As an example, suppose WC_1<$WC_{off}$<WC_2 and that the multiple memory dies are using Trim Suite 2 (see Table 1) when the first memory die fails. The processing device still switches the die trims of the multiple, original memory dies to Trim Suite 3 when the write count value reaches WC_2 and to Trim Suite 4 when the write count value reaches WC_3, and so forth, following the dynamic die trim chart of Table 1.

TABLE 1

| Drive Write Count (WC) | Dynamic Trim Settings |
| --- | --- |
| [0, WC_1] | Trim Suite 1 |
| [WC_1, WC_2] | Trim Suite 2 |
| [WC_2, WC_3] | Trim Suite 3 |
| [WC_3, WC_4] | Trim Suite 4 |
| ... | ... |
| [WC_(L − 1), WC_L] | Trim Suite L |
| WC_L+ | Trim Suite (L + 1) |

At operation 260, the processing logic issues second commands to the memory device to modify die trim settings of the spare memory die at the respective check points offset from the offset value of the write counter, e.g., that was previously stored as $WC_{off}$. For example, following the above example, the spare memory die can initially use Trim Suite 1 when first put into service. The processing logic can issue a third command to the memory device to modify die trim settings of the first spare memory die in response to the value of the write counter reaching the offset value plus the first value ($WC_{off}$+WC_1). The processing logic can issue a fourth command to the memory device to modify die trim settings of the first spare memory die in response to the value of the write counter reaching the offset value plus the second value ($WC_{off}$+WC_2). The schedule put forth in the dynamic die trim chart can be modified (e.g., adjusted) in this way as follows: {$WC_{off}$+WC_1, $WC_{off}$+WC 2, ..., $WC_{off}$+WC_L}. Thus, the die trim settings of the first spare memory die can be customized to be dynamically modified based on a different point in time the spare memory die is activated within the memory sub-system 110.

Figure 3:
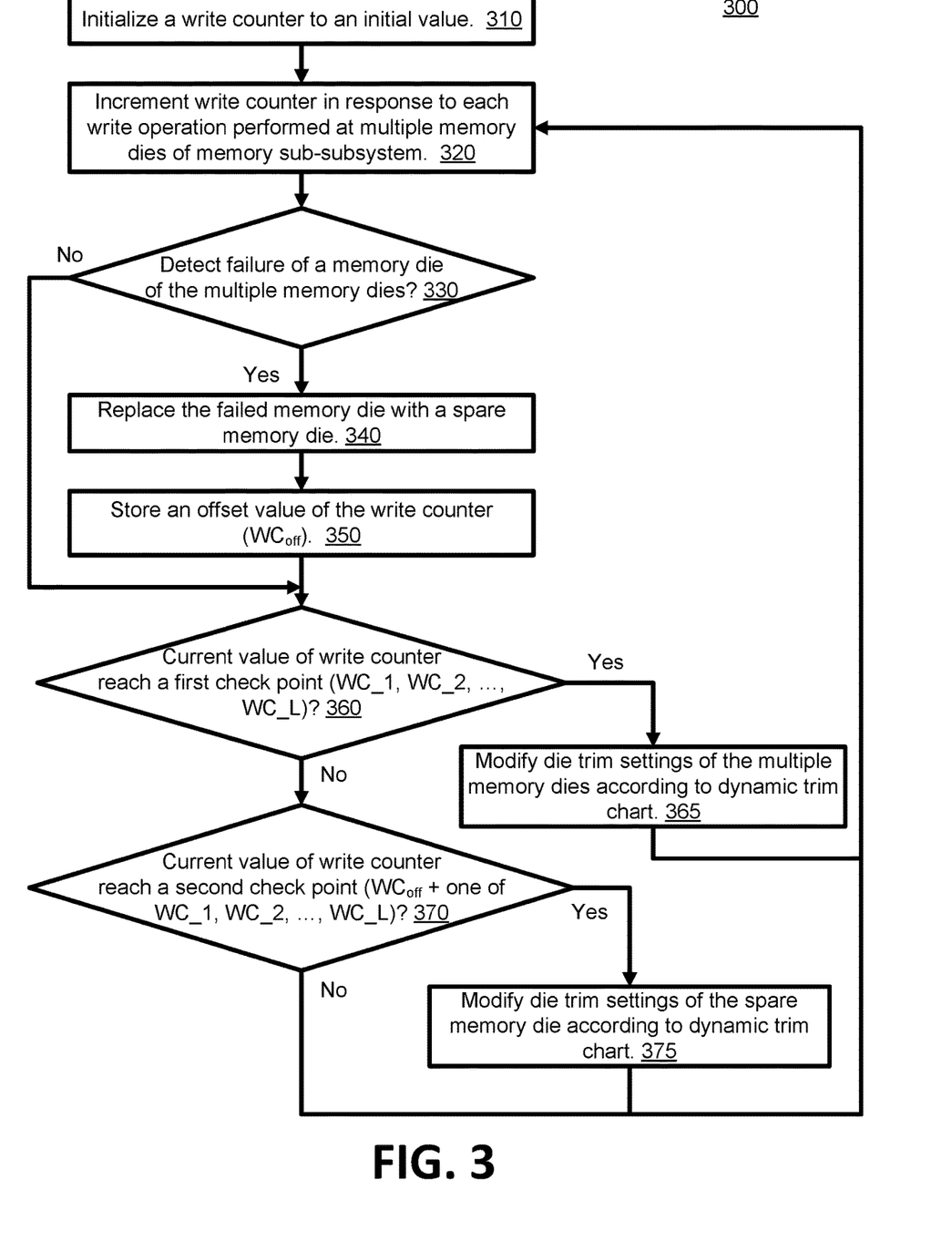
FIG. 3 is a flow diagram of an example method to modify dynamic trim settings in a memory device in accordance with additional embodiments of the present disclosure.

FIG. 3 is a flow diagram of an example method to modify dynamic trim settings in a memory device in accordance with additional embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the controller 115 (e.g., the device trim manager 113) of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic initializes a write counter to an initial value, e.g., zero ("0"), although another initial value can be used. At operation 320, the processing logic increments the write counter in response to each write operation performed at multiple memory dies of a memory subs-system. In one embodiment, the performance of the write operation means that the write operation was successful in that data has gone through ECC encoding and was written to a target memory address. At operation 330, the processing logic determines whether a failure of a memory die of the multiple memory dies has been detected. The failure can be a soft failure or a hard failure, as was previously discussed. If no failure is detected, the method 300 can loop forward to operation 360 (discussed below).

At operation 340, in response to detection of a failed memory die at operation 330, the processing logic can replace the failed memory with a spare memory die. This can be the first spare memory die 132A (FIG. 1B) if the failed die is a first memory die (of any of the multiple memory dies) to fail, for example. At operation 350, further in response to detection of the failed memory die at operation 330, the processing logic can store an offset value ($WC_{off}$) of the write counter. The offset value can represent the value of the write counter upon activation of the first spare memory die. The offset value can be stored in the local memory 119, in a register, or other memory (or buffer) coupled to the device trim manager 113.

At operation 360, the processing logic determines whether the current value of the write counter has reached a first check point, e.g., the next of WC_1, WC 2, ..., WC_L. If yes, then the processing logic, at operation 365, can modify die trim settings of the multiple memory dies according to the dynamic trim chart (Table 1). For example, the processing logic can issue a first command to the memory device to modify die trim settings of the multiple memory dies in response to the value of the write counter reaching a first value (e.g., WC_1), and issue a second command to the memory device to modify the die trim settings of the multiple memory dies in response to the value of the write counter reaching a second value (WC_2), and so forth.

If the answer is no at operation 360, then at operation 370, the processing logic can determine whether the current value of the write counter has reached a second check point, e.g., the next of $WC_{off}$+WC_1, $WC_{off}$+WC_2, . . . , $WC_{off}$+WC_L. If yes, then the processing logic, at operation 375, can modify die trim settings of the spare memory die according to the dynamic trim chart (Table 1), e.g., using a Trim Suite corresponding to the next of WC_1, WC_2, . . . . WC_L. For example, the processing logic can issue a third command to the memory device to modify die trim settings of the spare memory die to Trim Suite 2 in response to the value of the write counter reaching the offset value plus the first value ($WC_{off}$+WC_1). The processing logic can issue a fourth command to the memory device to modify die trim settings of the spare memory die to Trim Suite 3 in response to the value of the write counter reaching the offset value plus the second value ($WC_{off}$+WC_2). The processing logic can continue with this pattern for further check points based on the offset value ($WC_{off}$). If the answer is no at operation 370 or there is no active spare memory die yet, then the processing logic can loop back to additional incrementing of the write counter at operation 320.

In further embodiments of the method 300, assume that in iterations of the method flow, at operation 340, the processing logic activates a second spare memory die, e.g., in response to a failure of a second memory die of the multiple memory dies. At operation 350, the processing logic can store a second offset value of the write counter, e.g., where the second offset value ($WC_{off\_2}$) represents the value of the write counter when the second memory die is replaced with the second spare memory die.

In this situation, at some point in iterations of the method 300, at operation 370, the processing logic can determine the current value of the write counter has reached a next check point of $WC_{off\_2}$ plus the first value (WC_1). At operation 375, the processing logic can issue a fifth command to the second spare memory die to modify the die trim settings of the second spare memory die to Trim Suite 2 in response to the value of the write counter reaching the second offset value plus the first value ($WC_{off\_2}$+WC_1). At another moment through the method flow of the method 300, the processing logic can determine the current value of the write counter has reached a next check point of $WC_{off\_2}$ plus the second value (WC_2). At operation 375, the processing logic can issue a sixth command to the second spare memory die to modify the die trim 1 settings of the second spare memory die to Trim Suite 3 in response to the value of the write counter reaching the second offset value plus the second value ($WC_{off\_2}$+WC_2). As can be seen, these iterations through the method 300 can yield a number of offsets and check points to separately govern the timing of modification of die trim settings of each spare memory die that is activated.

Figure 4:
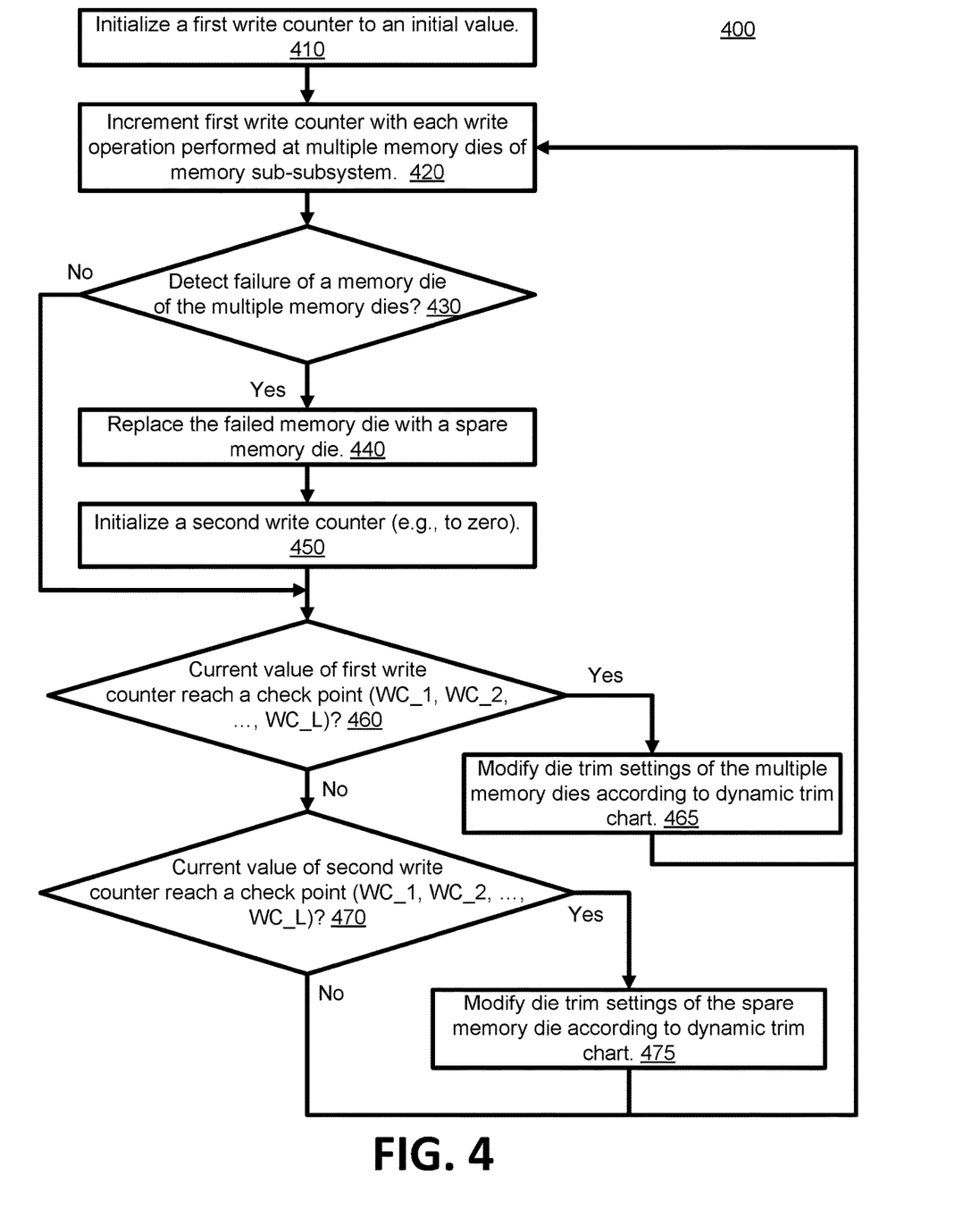
FIG. 4 is a flow diagram of an example method to modify dynamic trim settings in a memory device in accordance with further embodiments of the present disclosure.

FIG. 4 is a flow diagram of an example method to modify dynamic trim settings in a memory device in accordance with further embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the controller 115 (e.g., the device trim manager 113) of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic initializes a write counter to an initial value, e.g., zero ("0"), although another initial value can be used. At operation 420, the processing logic increments the write counter in response to each write operation performed at multiple memory dies of a memory subs-system. In one embodiment, the performance of the write operation means that the write operation was successful in that data has gone through ECC encoding and was written to a target memory address. At operation 430, the processing logic determines whether a failure of a memory die of the multiple memory dies has been detected. The failure can be a soft failure or a hard failure, as was previously discussed. If no failure is detected, the method 400 can loop forward to operation 460 (discussed below).

At operation 440, in response to detection of a failed memory die at operation 430, the processing logic can replace the failed memory with a spare memory die. This can be the first spare memory die 132A (FIG. 1B) if the failed die is a first memory die to fail, for example. At operation 450, further in response to detection of the failed memory die at operation 430, the processing logic can initialize a second write counter, e.g., to a zero value. The value of the second write counter represents write counts of write operations performed at the first spare memory die.

At operation 460, the processing logic determines whether the current value of the first write counter has reached a first check point, e.g., the next of WC_1, WC_2, ..., WC_L. If yes, then the processing logic, at operation 465, can modify die trim settings of the multiple memory dies according to the dynamic trim chart (Table 1). For example, the processing logic can issue a first command to the memory device to modify die trim settings of the multiple memory dies to Trim Suite 2 in response to the value of the write counter reaching a first value (e.g., WC_1), and issue a second command to the memory device to modify the die trim settings of the multiple memory dies to Trim Suite 3 in response to the value of the write counter reaching a second value (WC_2), and so forth.

If the answer is no at operation 460, then at operation 470, the processing logic can determine whether the current value of the second write counter has reached a second check point, e.g., the next of WC_1, WC_2, ..., WC_L. If yes, then the processing logic, at operation 475, can modify die trim settings of the spare memory die according to the dynamic trim chart (Table 1), e.g., using a Trim Suite corresponding to the next of WC_1, WC_2, ... WC_L. For example, the processing logic can issue a third command to the memory device to modify die trim settings of the spare memory die to Trim Suite 2 in response to the value of the second write counter reaching the first value (WC_1). The processing logic can issue a fourth command to the memory device to modify die trim settings of the spare memory die to Trim Suite 3 in response to the value of the second write counter reaching the second value (WC_2). The processing logic can continue with this pattern for further check points governed off of the value of the second write counter. If the answer is no at operation 470 or there is no active spare memory die yet, then the processing logic can loop back to additional incrementing of the first write counter at operation 420. Although not specifically illustrated, operation 420 can also be understood to increment the second write counter (if initiated at operation 450) for each write operation performed at the spare memory die.

In further embodiments of the method 400, assume that in iterations of the method flow, at operation 440, the processing logic activates a second spare memory die, e.g., in response to a failure of a second memory die of the multiple memory dies. At operation 450, the processing logic can initialize a third write counter, e.g., to zero. The value of the third write counter can then be compared against check points (at operations 470 and 475) of causing modifications to die trim settings of the second spare memory die, similarly as the second write counter does for the first spare memory die. Further, the incrementing at operation 420 can further include incrementing the third write counter for each write operation performed at the second spare memory die.

In some embodiments, the method 300 of FIG. 3 can be interleaved into the method 400 of FIG. 4, in which the processing logic (at operation 450 of the method 400) can skip over to operation 350 of the method 300 (FIG. 3). At operation 350, further in response to detection of the second failed memory die at operation 430, the processing logic can store an offset value ($WC_{off}$) of the write counter (or the second write counter). The offset value can represent the value of the write counter (or second write counter) upon activation of the second spare memory die. The operations 370 and 375 can then be interleaved within the method 400, using the offset value to determine the timing at which modifications are dynamically made to the die trim settings of the second spare die. In this way, use of a third (or subsequent) write counter can be avoided in the case of activation of a second (or subsequent) spare memory die in at least one embodiment.

Figure 5:
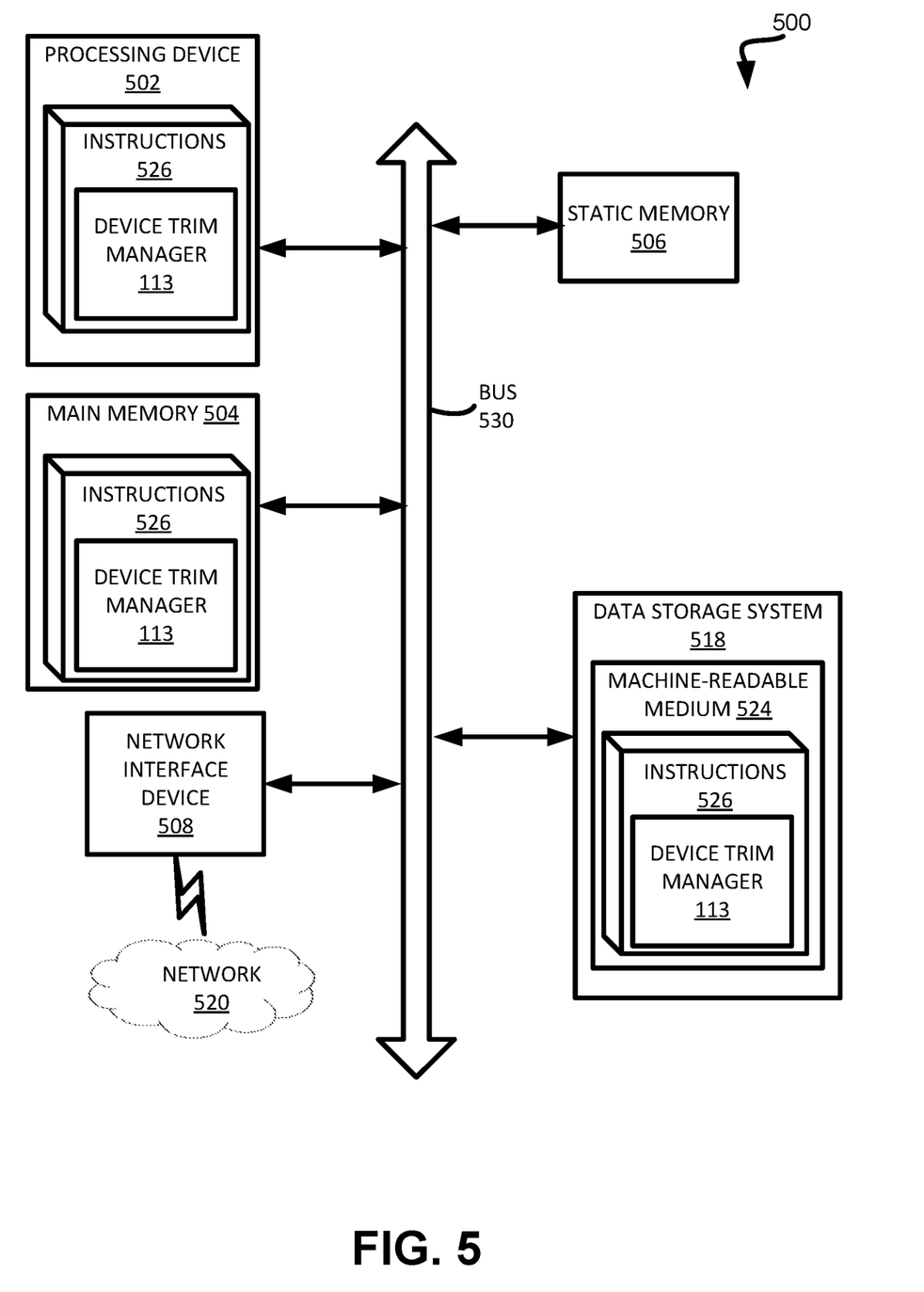
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1A) that includes, is coupled to, or utilizes a memory sub-system (e.g., the memory sub-system 110 of FIG. 1A) or can be used to perform the operations of a controller 115 (e.g., to execute an operating system to perform operations corresponding to the device trim manager 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1A.

In one embodiment, the instructions 526 include instructions to implement functionality corresponding to an error determining component (e.g., the device trim manager 113 of FIG. 1A). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of memory dies and at least a first spare memory die; and
a processing device coupled to the memory device, the processing device to perform operations comprising:
tracking a value of a write counter representing a number of write operations performed at the plurality of memory dies;
activating the first spare memory die in response to detecting a failure of a first memory die of the plurality of memory dies;
storing an offset value of the write counter in response to activating the first spare memory die; and
commanding the memory device to modify die trim settings of the first spare memory die at predetermined check point values of the write counter that are offset from the offset value, wherein the die trim settings comprise values related to parameters and specification requirements associated with media characteristics that change as the first spare memory die ages.

2. The system of claim 1, wherein activating the first spare memory die comprises transferring data from the first memory die to the first spare memory die.

3. The system of claim 1, wherein commanding the memory device comprises:
issuing a first command to the memory device to modify die trim settings of the plurality of memory dies in response to the value of the write counter reaching a first value;
issuing a second command to the memory device to modify the die trim settings of the plurality of memory dies in response to the value of the write counter reaching a second value; and
issuing a third command to the memory device to modify die trim settings of the first spare memory die in response to the value of the write counter reaching the offset value plus the first value.

4. The system of claim 3, wherein the first value and the second value each comprise a predetermined number of write operations as tracked by the write counter.

5. The system of claim 1, wherein the operations further comprise:
initializing the write counter upon initial activation of the memory device; and
incrementing the write counter in response to each write operation performed at the plurality of memory dies.

6. The system of claim 1, wherein the offset value is a first offset value, and wherein the operations further comprise:
activating a second spare memory die in response to detection of a failure of a second memory die of the plurality of memory dies; and
storing a second offset value of the write counter upon activation of the second spare memory die.

7. The system of claim 6, wherein commanding the memory device comprises:
issuing a first command to the memory device to modify die trim settings of the plurality of memory dies in response to the value of the write counter reaching a first value;
issuing a second command to the memory device to modify the die trim settings of the plurality of memory dies in response to the value of the write counter reaching a second value;
issuing a third command to the memory device to modify the die trim settings of the first spare memory die in response to the value of the write counter reaching the first offset value plus the first value; and
issuing a fourth command to the memory device to modify the die trim settings of the second spare memory die in response to the value of the write counter reaching the second offset value plus the first value.

8. The system of claim 1, wherein the failure of the first memory die is one of a hard failure or a soft failure.

9. A method comprising:
tracking a value of a write counter representing a number of write operations performed at a plurality of memory dies of a memory device;
activating a first spare memory die of the memory device in response to detecting a failure of a first memory die of the plurality of memory dies;
storing an offset value of the write counter in response to activating the first spare memory die; and
commanding the memory device to modify die trim settings of the first spare memory die at predetermined check point values of the write counter that are offset from the offset value, wherein the die trim settings comprise values related to parameters and specification requirements associated with media characteristics that change as the first spare memory die ages.

10. The method of claim 9, wherein commanding the memory device comprises:
issuing a first command to the plurality of memory dies to modify die trim settings of the plurality of memory dies in response to the value of the write counter reaching a first value;
issuing a second command to the plurality of memory dies to modify the die trim settings of the plurality of memory dies in response to the value of the write counter reaching a second value; and
issuing a third command to the spare memory die to modify die trim settings of the spare memory die in response to the value of the write counter reaching the offset value plus the first value.

11. The method of claim 10, wherein the first value and the second value each comprise a predetermined number of write operations as tracked by the write counter.

12. The method of claim 9, further comprising:
initializing the write counter upon initial activation of the memory device; and
incrementing the write counter in response to each write operation performed at the plurality of memory dies.

13. The method of claim 9, wherein the offset value is a first offset value, further comprising:
activating a second spare memory die in response to detection of a failure of a second memory die of the plurality of memory dies; and
storing a second offset value of the write counter upon activation of the second spare memory die.

14. The method of claim 13, the method further comprising:
issuing a first command to the memory device to modify die trim settings of the plurality of memory dies in response to the value of the write counter reaching a first value;
issuing a second command to the memory device to modify the die trim settings of the plurality of memory dies in response to the value of the write counter reaching a second value;
issuing a third command to the memory device to modify the die trim settings of the first spare memory die in response to the value of the write counter reaching the first offset value plus the first value; and
issuing a fourth command to the memory device to modify the die trim settings of the second spare memory die in response to the value of the write counter reaching the second offset value plus the first value.

15. A system comprising:
a first write counter;
a second write counter;
a memory device comprising a plurality of memory dies and at least a first spare memory die; and
a processing device coupled to the memory device, to the first write counter, and to the second write counter, the processing device to perform operations comprising:
initializing the first write counter;
incrementing a value of the first write counter in response to each write operation performed at the plurality of memory dies; and
in response to detecting a failure of a first memory die of the plurality of memory dies:
activating the first spare memory die; and
initializing the second write counter, wherein a value of the second write counter represents write counts of write operations performed at the first spare memory die; and
commanding the memory device to modify die trim setting of the first spare memory die based on a value of at least one of the first write counter or the second write counter, wherein the die trim settings comprise values related to parameters and specification requirements associated with media characteristics that change as the first spare memory die ages.

16. The system of claim 15, wherein activating the first spare memory die comprises transferring data from the first memory die to the first spare memory die, and wherein the operations further comprise incrementing the value of the second write counter in response to each write operation performed at the spare memory die.

17. The system of claim 15, wherein commanding the memory device comprises:
  issuing a first command to the memory device to modify die trim settings of the plurality of memory dies in response to the value of the first write counter reaching a first value;
  issuing a second command to the memory device to modify the die trim settings of the plurality of memory dies in response to the value of the first write counter reaching a second value;
  issuing a third command to the memory device to modify die trim settings of the first spare memory die in response to the value of the second write counter reaching the first value; and
  issuing a fourth command to the memory device to modify die trim settings of the first spare memory die in response to the value of the second write counter reaching the second value.

18. The system of claim 17, wherein, for the first command and the second command, the first value and the second value each comprise a predetermined number of write operations as tracked by the first write counter, and for the third command and the fourth command, the first value and the second value each comprise the predetermined number of write operations as tracked by the second write counter.

19. The system of claim 15, wherein the operations further comprise:
  activating a second spare memory die in response to detection of a failure of a second memory die of the plurality of memory dies; and
  storing an offset value of the first write counter in response to the detection of the failure of the second memory die.

20. The system of claim 19, wherein commanding the memory device comprises:
  issue a first command to the memory device to modify die trim settings of the plurality of memory dies in response to the value of the first write counter reaching a first value;
  issue a second command to the memory device to modify the die trim settings of the plurality of memory dies in response to the value of the first write counter reaching a second value;
  issue a third command to the memory device to modify die trim settings of the first spare memory die in response to the value of the second write counter reaching the first value;
  issue a fourth command to the memory device to modify die trim settings of the first spare memory die in response to the value of the second write counter reaching the second value;
  issue a fifth command to the memory device to modify die trim settings of the second spare memory die in response to the value of the first write counter reaching the offset value plus the first value; and
  issue a sixth command to the memory device to modify die trim settings of the second spare memory die in response to the value of the first write counter reaching the offset value plus the second value.

* * * * *